PROCESS FOR FABRICATING SMALL GEOMETRY HIGH FREQUENCY SEMICONDUCTOR DEVICE

Filed Jan. 5, 1970

INVENTOR.

Lowell Clark · Douglas L. Elgan

BY

Mueller, Aichele & Rauner

ATTY'S.

3,681,153
Patented Aug. 1, 1972

3,681,153
PROCESS FOR FABRICATING SMALL GEOMETRY HIGH FREQUENCY SEMICONDUCTOR DEVICE

Lowell Clark, Phoenix, and Douglas L. Elgan, Tempe, Ariz., assignors to Motorola, Inc., Franklin Park, Ill.

Filed Jan. 5, 1970, Ser. No. 680
Int. Cl. H01l 7/44
U.S. Cl. 148—187 5 Claims

ABSTRACT OF THE DISCLOSURE

Disclosed is an improved high frequency shallow junction PN semiconductor device and process for making same. A multilayer diffusion mask having a differential etch rate is provided by a controlled etching process, so that the lower layer of the mask limits the lateral extent to an impurity diffusion to form a shallow PN junction within the device. An upper layer of the mask serves to protect the shallow PN junction against electrical shorting during a metal deposition step to form an electrode for the semiconductor device.

BACKGROUND OF THE INVENTION

This invention relates generally to semiconductor device fabrication processes and more particularly to a process for making shallow junction transistors or similar multilayer semiconductor devices utilizing an improved shadow masking method. This invention also is embodied in a novel high speed shallow junction transistor fabricated by the above process.

In the fabrication of shallow PN junction semiconductor devices, such as transistors, it has been one prior art practice to successively form active regions of the device, such as the base and the emitter regions of a transistor, using standard photolithographic masking, etching, and diffusion techniques. For example, it is well known to use silicon dioxide as a diffusion mask to limit and define the lateral extent of an impurity diffusion in silicon. In the fabrication of small geometry transistors, and after the completion of the emitter diffusion, a so-called "emitter washout" process has been used wherein a thin oxide coating formed during the diffusion of the emitter region is subsequently buffer etched or "washed out" in preparation for a subsequent metal deposition step to form the emitter ohmic contact. In the latter process step, a metal such as aluminum is vapor deposited on the re-exposed emitter surface area of the semiconductor body. If the lateral extent of the emitter diffusion is such that the base-emitter PN junction remains covered by the remaining surface oxide coating after the buffer etch or "emitter washout" step, then this PN junction will remain oxide passivated and stabilized after the application of ohmic contact metallization to the emitter region of the transistor.

Where large rather than small semiconductor devices are fabricated, then the standard photolithographic masking and etching steps can be used throughout the process to define ohmic contact areas of the active device regions without resorting to this so-called "emitter washout" or emitter buffer etch step. However, as the transistor geometries become smaller and smaller for ultra high frequency devices, problems of registration become more severe and it becomes impractical, if not impossible, to align a photolithographic pattern on a photosensitive emulsion (e.g., a compound such as Kodak Thin Film Resist or the former Kodak Metal Etch Resist, sometimes generically termed photoresist and abbreviated "KMER," within the desired emitter area. For this reason, the so-called "emitter washout process" evolved, and in this process a buffer etch can be used to merely wash out the small amount of oxide remaining on the emitter surface after the emitter diffusion and caused by the oxidation of silicon during the emitter diffusion.

While the above described emitter washout process has been quite satisfactory for most applications, the etching step employed in the washout process can, in the fabrication of shallow PN junction devices and in the absence of extremely careful etching control, remove the silicon surface oxide from a PN junction such as the shallow emitter-base PN junction of a bipolar transistor. This PN junction will then be exposed to the overlay metallization which is used to form the emitter electrode of the transistor. This overlay metallization will then cause PN junction shorting, which will result in failure of the transistor or other similar PN junction semiconductor device. Thus, it would be desirable to preserve all of the advantages associated with the emitter washout process in the fabrication of small geometry semiconductor devices and yet simultaneously eliminate the problem of PN junction shorting previously described.

SUMMARY OF THE INVENTION

An object of the present invention is to provide a new and improved small geometry semiconductor device and process for making same.

Another object of this invention is to provide a new and improved process for fabricating semiconductor devices which eliminates the electrical shorting of semiconductor device PN junctions. At the same time, this process utilizes all of the advantages of the emitter washout process which itself eliminates certain registration problems in the fabrication of small geometry semiconductor devices.

A feature of the present invention is the provision of a novel etching process wherein a multi-layer diffusion mask is differentially etched to permit an impurity to diffuse to a desired lateral extent into the semiconductor body to form a PN junction. This mask simultaneously protects this PN junction from electrode metallization shorting.

Another feature of this invention is the provision of a novel multi-layer diffusion mask for a semiconductor body and process for fabricating same wherein one of the layers of the mask serves to limit and define the lateral extent of an impurity diffusion, and another of the layers of the mask serves to subsequently protect a PN junction defining an active device region formed within the semiconductor body by the impurity diffusion.

These and other objects and features of this invention will become more fully apparent in the following description of the accompanying drawings.

BRIEF DESCRIPTION OF THE INVENTION

Briefly, the present invention is directed to a new semiconductor device and process for making same wherein an impurity diffusion mask having at least first and second layers therein is applied to the surface of a semiconductor body or to a protective coating thereon, and the first layer of the diffusion mask has an etch rate which is different from the etch rate of the second layer of the mask. Selected areas of the first and second layers of the diffusion mask are exposed to an etchant which will preferentially attack the first layer to the substantial exclusion of the second layer, so that the resultant structure after etching includes a portion of the second layer which overhangs a portion of the first layer. This overhanging portion of the second layer protects a device PN junction in the semiconductor body against electrical shorting by the subsequent metal deposition through an opening in the diffusion mask to form an ohmic contact to the semiconductor body.

DETAILED DESCRIPTION OF THE INVENTION

Figure 1A:
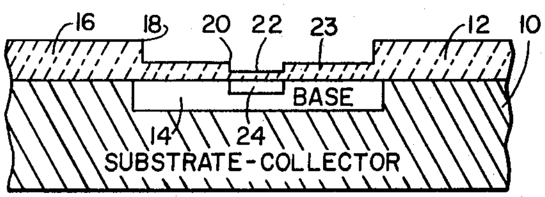
FIGS. 1A and 1B illustrate the problem solved by the present invention by illustrating a prior art shallow PN junction structure and process for fabricating same.

Referring to FIG. 1A, there is shown a planar type transistor structure having base and emitter regions 14 and 24 fabricated in a collector substrate 10 using known diffusion and photolithographic techniques. The semiconductor material 10 may be typically, although not limited to, silicon. An oxide masking layer 16 is formed on the upper surface of the silicon substrate 10, and the oxide layer 16 has steps 18 and 20 therein due to previous multiple diffusions as is well understood. Thus, a very thin oxide layer 22 covers the surface area of the emitter region 24, and the layer 22 is normally formed by the oxidation of silicon during the diffusion process in which emitter region 24 is formed.

In the fabrication of very small geometry, high frequency transistors, the transistor emitter region 24 has a very shallow depth, typically less than approximately 0.2 micron, and the width of the emitter window (opening 20) in the oxide diffusion mask 16 is typically in the order of one micron. During the formation of the emitter region 24 of the prior art shallow junction transistor, the oxide portion 22 is re-formed on the emitter 24 surface by the oxidation of silicon. This emitter window or opening 20 is normally too small to permit the subsequent alignment within the opening 20 of a photolithographic pattern. Such pattern (not shown) is for the purpose of masking some of the passivating emitter oxide portion 22 against etching in order to reopen a selected emitter ohmic contact area. Therefore, a process which has been commonly referred to in the art as an "emitter washout" process has been used to remove (by controlled buffer etching) some of the emitter oxide 22 from the surface of the silicon substrate 10. This oxide portion 22 covering the emitter window 20 is the thinnest oxide of any of the oxide covering the surface of the silicon substrate 10. Therefore, if the entire oxide layer or covering 16 is exposed to a selected etchant under controlled etching conditions, the thin oxide layer 22 will be removed first to reexpose the emitteer region 24 for ohmic contact.

Figure 1B:
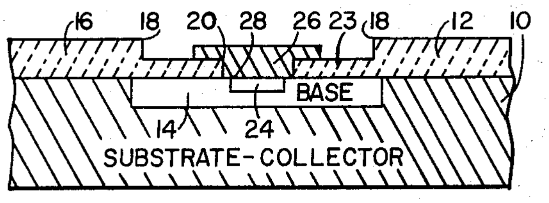

If there is sufficient lateral diffusion of the emitter region 24 beneath the portion 23 of the intermediate thickness oxide and the emitter-base PN junction is protected by this oxide portion 23 after the emitter washout process, then metallization may be applied to the exposed portion emitter region 24 to provide ohmic contact thereto without shorting the emitter-base PN junction. However, for very shallow emitter semiconductor devices wherein the emitter region is diffused into the semiconductor body to a depth of approximately 0.2 micron or less, there is very little lateral diffusion of the emitter region 24 underneath the intermediate thickness oxide portion 23. In this case, the subsequent deposition of an emitter metallization 26 as shown in FIG. 1B will short out the emitter-base junction 28 if this PN junction 28 is exposed by the controlled etching step prior to depositing the emitter metallization 26. This PN junction exposure could be caused, for example, by only slightly overetching the emitter oxide 22, and even a very slight etching of the intermediate oxide portion 23 can cause the latter oxide to be removed from the PN junction 28 as shown in FIG. 1B. Thus, while the prior art emitter washout process has certain advantages in overcoming registration problems in the fabrication of small geometry transistors, it can also cause electrical shorting of the emitter-base or other shallow PN junctions of a semiconductor device. Thus, in the structure an dprocess described in FIGS. 1A and 1B, it would be desirable if the lateral diffusion of the emitter region 24 could be increased without sacrificing the above described advantages of the emitter washout process and the advantages related to the formation of a very shallow PN junction. It is to these ends that the present invention is primarily directed.

Figure 2C:
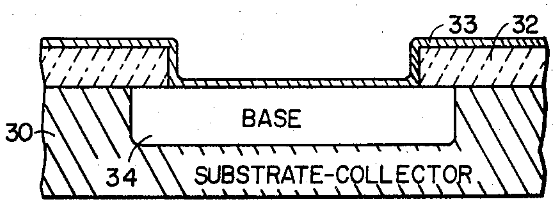
FIGS. 2A through 2F illustrate, by a sequence of process steps, the fabrication process and small geometry semiconductor device structure according to the present invention.
Figure 2D:
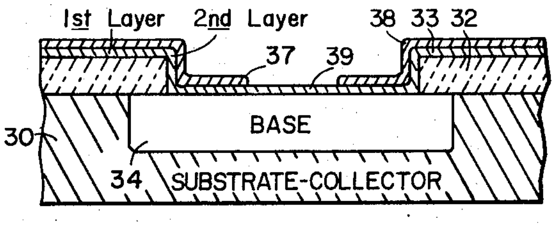
Figure 2A:
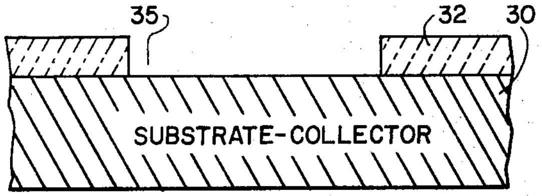

Consider now the present invention which is illustrated in FIG. 2A through 2F. In FIG. 2A, an insulating layer 32, such as silicon dioxide, is either thermally grown or vapor deposited on a silicon substrate 30, and by using known photolithographic techniques, an opening 35 is made in the oxide layer 32 in preparation for a subsequent diffusion step. This oxide layer 32 will also be referred to herein as a first mask. A selected impurity is then passed through the opening 35 and allowed to diffuse into the silicon body 30 at a selected diffusion temperature to form a region 34 which may, for example, be a transistor base region. In the structure shown in FIG. 2, the substrate 30 or a portion thereof would serve as the transistor collector region. In very shallow PN junction devices, such as ultra high speed microwave transistors, region 34 may be diffused typically to a depth of approximately 0.3 micron.

Figure 2E:
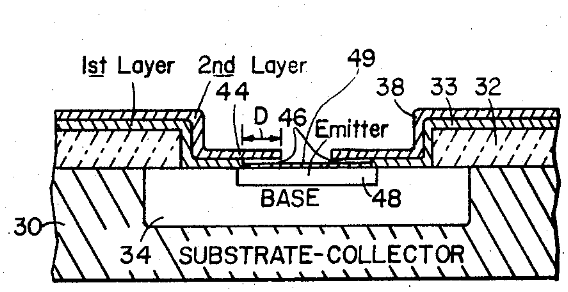
Figure 2B:
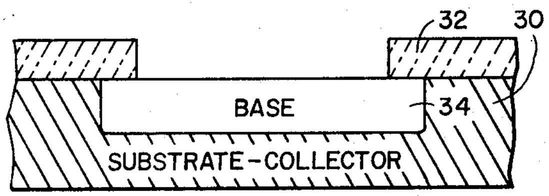
Figure 2F:
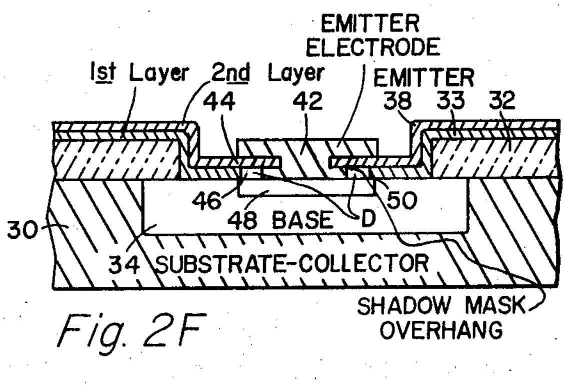

Next, a first insulating layer 33 such as silicon oxide or silicon dioxide ($SiO_2$) is formed by heating and oxidizing the structure shown in FIG. 2B at an oxidation temperature of approximately 900° C. for approximately 15 minutes. In this step, a layer 33 of $SiO_2$ approximately 500 angstroms in thickness is thermally grown as illustrated in FIG. 2C.

After the first insulating layer 33 is formed as described above, a second insulating layer 38 of silicon nitride, $Si_3N_4$, is formed by pyrolysis in either of the following reactions:

$$NH_3+SiH_4+\text{heat}\rightarrow Si_3N_4+H_2$$

or $$NH_3+SiCl_4+\text{heat}\rightarrow Si_3N_4+HCl+H_2$$

This layer 38 of $Si_3N_4$ is formed over the entire upper surface of the structure shown in FIG. 2C. Using photolithographic masking techniques, an opening 37 is made in the second insulating $Si_3N_4$ layer 38 as shown in FIG. 2D. These photolithographic techniques are well known in the art and include the use of a commercially available photosensitive emulsion (e.g., a compound such as Kodak Thin Film Resist or KMER, previously described but not shown in the drawings). The first and second insulating layers 33 and 38 form what will be referred to herein as a second mask, and the first layer 33 has an etch rate which is different from the etch rate of the second layer 38. More specifically, the first layer 33 etches faster than second layer 38 when the two layers 33 and 38 are simultaneously exposed to a selected etchant such as hydrofluoric acid, HF.

For best results for achieving the above differential etch rates, the $SiO_2$ layer 33 should remain undoped by boron, since a boron-doped $SiO_2$ layer tends to etch more slowly than an undoped $SiO_2$. The silicon nitride layer 38 is deposited preferably at approximately 800° C., and it has been found that the $Si_3N_4$ layer 38, when deposited at this or higher temperatures, exhibits best differential etching results to be described in more detail below.

The opening 37 in the second layer 38 is formed by exposing a selected portion of the silicon nitride layer 38 to phoshoric acid, $H_3PO_4$. This acid readily etches the silicon nitride layer 38 but only slowly attacks the silicon dioxide layer 33 when the two layers 33 and 38 are formed as described above. When the portion of the second layer 38 previously within the opening 33 (FIG. 2D) is exposed to phosphoric acid, $H_3PO_4$, at approximately 180° C., the silicon nitride layer 38 etches at a rate of approximately 100 angstroms per minute. When the $SiO_2$ layer 33 is exposed to the phosphoric acid at the same temperature, layer 33 will be etched at a rate of approximately 15 angstroms per minute. Thus, the opening 37 is initially made to expose a portion 39 of the silicon dioxide layer 33 without substantially etching the layer 33 as shown in FIG. 2D.

Next, both the portion 39 of the first $SiO_2$ layer 33 and the entire $Si_3N_4$ second layer 38 are simultaneously exposed to the etchant hydrofluoric acid, HF, and this HF etchant rapidly attacks the portion 39 of the $SiO_2$ layer 33 while only slowly attacking the second layer 38. The hydrofluoric acid etchant not only removes the portion 39 of the first layer 33, but also laterally etches a portion of the second layer 33 beneath the silicon nitride layer 38, thus undercutting the silicon nitride layer 33. The $Si_3N_4$ layer 38 in FIG. 2E will be etched by hydrofluoric acid, HF, at a rate of approximately 100 angstroms per minute at 25° C., whereas the $SiO_2$ layer 33 will be etched by the HF at approximately 2000 angstroms per minute at 25° C.

The innermost portions of the $Si_3N_4$ layer 38 form a mask overhang region 44 underneath which is a void 46. This void 46 serves to increase the lateral extent to which the emitter region 48 will diffuse as shown in FIG. 2E. The distance D between the edge of the mask overhang region 44 and the edge of the first layer of silicon dioxide 33 may be as much as 0.5 micron. Thus, when an impurity is passed, for example, by solid state diffusion through the opening 37 between the ends of the overhanging region 44, such impurity is allowed to pass through the void 46 and into the substrate 30 to form region 48 as shown in FIG. 2E. Such diffusion will cause the PN junction 50 to have a surface termination point quite remote from the ends of the $Si_3N_4$ mask overhang region 44.

After the formation of the emitter region 48, the thin oxide layer 49 (FIG. 2E) formed by the oxidation of silicon during the emitter 48 diffusion is buffer etched or "washed out" as previously described with reference to FIGS. 1A and 1B. It is preferred that this buffer etching or washout step is so carefully controlled that the PN junction 50 underlies at least a small portion of the first, pyrolytic layer 33 of silicon dioxide. The semiconductor device fabricated will be more stable if the PN junction 50 is permanently protected by the oxide layer 33 during the life of the semiconductor device. However, if a portion of the emitter-base PN junction 50 is accidentally exposed during this emitter washout process at the point where this junction terminates at the surface of the silicon substrate 30, such PN junction exposure will not cause semiconductor device failure in accordance with the teachings of the present invention. That is, in FIG. 2F, when the emitter metallization 42 is deposited such as by the evaporation of aluminum through the opening 37 in the silicon nitride mask which consists of the second layer 38, such metallization 42 is geometrically masked against any substantial lateral movement by the over-hanging nitride portion 44 and is deposited on the emitter 48 surface area of the structure without filling up the void 46 and shorting the emitter-base junction 50. There may be some slight adherence of the hot aluminum metallization 42 underneath the edges of the silicon nitride overhang region 44. But the viscosity of this aluminum can be controlled in accordance with the state of the art aluminum deposition techniques so that the aluminum metallization 42 is deposited substantially vertical to the surface of the silicon substrate 30 and there caused to make good ohmic contact to the surface area of the emitter region 48. Thus, the metallization 42 is not permitted to flow laterally into the void 46 and, therefore, will not cause a shorting of the emitter-base PN junction 50. Summarizing, this mask overhang region 44 and void 46 function both to: (1) allow the substantial lateral diffusion of the emitter region 48 so that the emitter-base PN junction 50 extends to the surface of the silicon substrate 30 at a point remote from the mask opening 37, and (2) thereafter overhang region 44 protects the PN junction 50 from contact with the aluminum metallization 42 which is deposited on the structure shown in FIG. 2F to form the emitter electrode.

The new and improved shallow junction, high speed semiconductor device described above in accordance with the novel process of the present invention has been actually built and successfully tested. Using this process, NPN transistors have been made with base junction depths of approximately 0.3 micron, emitter junction depths of approximately 0.1 micron, emitter window openings of approximately 1 micron and an underetch distance D (see FIGS. 2E and 2F) of approximately 0.5 micron. The first or pyrolytic silicon doixide layer 33 was deposited to a depth of approximately 500 angstroms and the second or silicon nitride layer 38 was deposited to a depth of approximately 1000 angstroms. Approximately 2000 angstroms of aluminum were used in the formation of the metal electrode 42.

It should be emphasized that the present invention is not limited to the particular types of insulating material used in the formation of the first and second layers 33 and 38, and it is only necessary that in the formation of void 46 the first layer 33 should etch substantially faster than the second layer 38 when exposed to a single etchant such as the hydrofluoric acid.

Within the scope of this invention, there are many other masking materials which can be used to form the layers 33 and 38. The layer 38 could be formed, for example, of aluminum oxide. $Al_2O_3$, in combination with an $SiO_2$ layer 33 to form the above described sandwich structure. Layer 38 can also be formed of silicon carbide, magnesium oxide, zirconium oxide, and boron nitride. Also, layer 33 could be a metal selected from the group of metals consisting of aluminum, nickel, chrome, and molybdenum and such metal films can be sputter deposited or evaporated as well as vapor deposited.

Additionally, this invention is not limited to the fabrication of transistors, and various types of four and five layer PNPN semiconductor devices requiring shallow diffusions are within the scope of this invention.

We claim:

1. In a process for fabricating a small geometry, shallow junction semiconductor device wherein a shallow emitter is diffused into a base region and contacts made thereto using the emitter oxide washout technique, the improvements which include steps of:

(a) applying a mask comprising at least first and second adjacent layers to the surface of a semiconductor body, prior to diffusion of the shallow emitter, with said first layer being adjacent to a surface of the semiconductor body and having a different etch rate from that of said second layer when exposed to a preselected etchant, (b) etching through selected exposed areas of said first and second layers to form an opening in said mask, said first layer being etched to a greater lateral extent then said second layer, (c) diffusing an impurity for the shallow emitter so that when the impurity is allowed to pass through said opening, the impurity moves laterally beneath said second layer and into said semiconductor body, thereby establishing a PN junction in said semiconductor body, said PN junction extending to said surface of said semiconductor body at points beneath and removed from the opening in said second layer whereby said second layer overhangs and protects said PN junction from electrical shorting when metallization is deposited on said semiconductor body and through said opening.

2. The process defined in claim 1 which further includes applying a selected metallization to said opening in said mask to provide ohmic electrical contact to an active region of said semiconductor device and formed by the introduction of said impurity into said semiconductor body.

3. The process defined in claim 2 wherein the application of said mask includes:

(a) forming a first selected coating with a first etch rate on the surface of said semiconductor body, and thereafter (b) forming a second selected coating on a surface of said first selected coating, said second selected coating having a second etch rate slower than said first etch rate in said preselected etchant, so that said second selected coating will be partially removed beneath said first selected coating when the two coatings are simultaneously exposed to said preselected etchant, and said second coating will extend over the edge of said first coating.

4. The process defined in claim 2 wherein the application of said mask includes:

(a) forming a first layer of silicon dioxide that will etch faster than silicon nitride when exposed to said preselected etchant, (b) forming a second layer of silicon nitride atop said first layer of silicon dioxide, so that said silicon dioxide may be preferentially etched underneath said layer of silicon nitride, and (c) said etching to remove selected portions of said first and second layers of said mask includes applying said preselected etchant comprising a hydrofluoric acid solution to selected exposed areas of said first and second layers of silicon dioxide and silicon nitride, respectively, so that said silicon dioxide is rapidly etched underneath said layer of silicon nitride while said silicon nitride is only being slowly etched by said hydrofluoric acid solution.

5. A process for fabricating a small geometry transistor or other multiple layer PN semiconductor devices having at least one shallow PN junction extending to the device surface of said process including the steps of:

(a) forming a first mask on a surface of a semiconductor body, (b) passing an impurity through an opening in said first mask to form a first region of one conductivity type within said body, (c) applying a second mask having first and second layers therein to the exposed surface of said first mask and to the surface of said semiconductor body exposed by said opening, said first and second layers having different etch rates, when exposed to a preselected etchant, (d) etching through selected exposed areas of said first and second layers to form an opening in said second mask so that said first layer is etched laterally to a greater extent than said second layer, (e) passing an impurity through etched openings in said first and second layers so that said impurity is permitted to move laterally into said semiconductor body and thereby form a second region in said body and establish a PN junction extending to the surface of said semiconductor body at points substantially removed from the opening in said second layer, whereby said second layer will serve as a protective mask against metallization deposits on any exposed portion of said PN junction, (f) said forming said first mask includes thermally growing a layer of silicon dioxide on a surface of said semiconductor body, and (g) said forming of said second mask includes initially thermally growing or pyrolytically depositing said first layer of silixon dioxide on the surface of said first mask and on an exposed surface area of said semiconductor body, and (h) subsequently forming a second layer of silicon nitride on said first layer of silicon dioxide to thereby form said second mask for said semiconductor body and having a differential etch rate, (i) applying a metallization to said opening in said second mask to thereby provide an ohmic electrical contact to said second region of said semiconductor body, (j) said first layer of said second mask is formed in an impurity free atmosphere so as to be substantially undoped when the formation of said first layer is complete, and (k) said second layer of said second mask is formed at temperatures of approximately 800° C. or higher, (l) forming said first layer includes forming a coating of silicon dioxide on said semiconductor body which will etch faster then said silicon nitride when exposed to a preselected etchant, and (m) said etching to form said opening in said second mask includes preferentially attacking said layer of silicon dioxide to the substantial exclusion of said layer of silicon nitride whereby a portion of said silicon dioxide underneath said layer of silicon nitride etched out to form a void underneath said layer of silicon nitride, so that impurities may pass laterally through said void and extend a PN junction to the surface of said semiconductor body at points remote from the opening in said layer of silicon nitride, (n) subjecting a selected area of said silicon nitride coating to phosphoric acid which readily etches said silicon nitride but very slowly attacks said silicon dioxide, and thereafter (o) subjecting a selected area of said silicon dioxide and exposed by said opening in said silicon nitride to a hydrofluoric acid etchant for a predetermined period of time to etch out said void in said first layer of said second mask.

References Cited

UNITED STATES PATENTS

| | | | |
|---|---|---|---|
| 3,165,430 | 1/1965 | Hugle | 148—187 |
| 3,255,056 | 6/1966 | Flatley | 148—187 |
| 3,275,910 | 9/1966 | Phillips | 148—187 |
| 3,298,879 | 1/1967 | Scott | 148—187 |
| 3,312,577 | 4/1967 | Dunster | 148—187 |
| 3,373,051 | 3/1968 | Ting Li Chu | 148—187 |
| 3,507,716 | 4/1970 | Sumo Nishida | 148—187 |

FOREIGN PATENTS

| | | | |
|---|---|---|---|
| 1,179,069 | 1/1970 | Great Britain | 148—187 |

HYLAND BIZOT, Primary Examiner